United States Patent
Soneda

(10) Patent No.: US 9,472,548 B2
(45) Date of Patent: Oct. 18, 2016

(54) REVERSE CONDUCTING SEMICONDUCTOR DEVICE

(71) Applicant: Mitsubishi Electric Corporation, Tokyo (JP)

(72) Inventor: Shinya Soneda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/800,353

(22) Filed: Jul. 15, 2015

(65) Prior Publication Data
US 2016/0148928 A1 May 26, 2016

(30) Foreign Application Priority Data
Nov. 21, 2014 (JP) ................. 2014-236495

(51) Int. Cl.
| | |
|---|---|
| H01L 27/06 | (2006.01) |
| H01L 29/739 | (2006.01) |
| H01L 29/417 | (2006.01) |
| H01L 29/10 | (2006.01) |
| H01L 29/16 | (2006.01) |
| H01L 29/20 | (2006.01) |

(52) U.S. Cl.
CPC ....... *H01L 27/0635* (2013.01); *H01L 29/1095* (2013.01); *H01L 29/1602* (2013.01); *H01L 29/1608* (2013.01); *H01L 29/2003* (2013.01); *H01L 29/417* (2013.01); *H01L 29/7397* (2013.01)

(58) Field of Classification Search
CPC .......... H01L 29/7397; H01L 27/0635; H01L 23/535
See application file for complete search history.

(56) References Cited

U.S. PATENT DOCUMENTS

| | | | |
|---|---|---|---|
| 2012/0326207 A1* | 12/2012 | Yoshimochi | .......... H01L 29/866 257/139 |
| 2013/0075784 A1* | 3/2013 | Ikeda | .................. H01L 27/0727 257/140 |
| 2013/0240947 A1 | 9/2013 | Matsudai et al. | |
| 2014/0070270 A1 | 3/2014 | Yoshida et al. | |

FOREIGN PATENT DOCUMENTS

| | | |
|---|---|---|
| JP | 2013-197122 A | 9/2013 |
| JP | 2014-075582 A | 4/2014 |

* cited by examiner

*Primary Examiner* — Matthew Reames
(74) *Attorney, Agent, or Firm* — Studebaker & Brackett PC

(57) ABSTRACT

A reverse conducting semiconductor device includes a high-concentration anode layer and a barrier metal layer, the width of the high-concentration anode layer is set larger than the width of contact of the barrier metal layer and the high-concentration anode layer, thereby ensuring that the area of contact between the barrier metal layer and the high-concentration anode layer is constant.

6 Claims, 4 Drawing Sheets

REVERSE CONDUCTING SEMICONDUCTOR DEVICE

BACKGROUND OF THE INVENTION

1. Field of the Invention

The present invention relates to a reverse conducting semiconductor device for use in home electric appliances, electric motor vehicles, railroad systems, solar or wind power systems, etc.

2. Background Art

Japanese Patent Laid-Open No. 2013-197122 discloses a reverse conducting semiconductor device (a reverse conducting insulated gate bipolar transistor (RC-IGBT)). The reverse conducting semiconductor device has an IGBT and a diode (free wheeling diode (FWD)) formed on one semiconductor substrate. In the reverse conducting semiconductor device disclosed in Japanese Patent Laid-Open No. 2013-197122, a p-anode layer and a p$^+$-anode layer are provided as an anode layer for the diode and an ohmic contact is established between the p$^+$-anode layer and an emitter electrode.

In a case where trench gates are formed in the entire surface of the semiconductor substrate, the trench gate interval may be reduced in order to reduce the area of the anode layer so that the performance of the diode is improved. If the trench gate interval is reduced, it is difficult to connect the anode layer and the emitter electrode by a contact electrode formed of aluminum for example. It is, therefore, preferable to connect the anode layer formed between the trench gates and the emitter electrode by tungsten plugs. If tungsten plugs are used, a barrier metal is provided between the tungsten plugs and the anode layer to prevent a material in the tungsten plug from diffusing into the semiconductor substrate (anode layer).

The width of contacts between the barrier metal and the anode layer is smaller than the trench gate interval. Therefore, if the p$^+$-anode layer (a high-concentration anode layer) is formed in island form as viewed in plan as disclosed in Japanese Patent Laid-Open No. 2013-197122, there is a problem that the area of contact between the barrier metal and the high-concentration anode layer is changed when the tungsten plug forming position is shifted. This change in contact area can be a cause of a variation in characteristic of the diode.

SUMMARY OF THE INVENTION

In view of the above-described problem, an object of the present invention is to provide a reverse conducting semiconductor device capable of making constant the area of contact between the barrier metal layer and the high-concentration anode layer.

The features and advantages of the present invention may be summarized as follows.

According to one aspect of the present invention, a reverse conducting semiconductor device includes a semiconductor substrate of a first conduction type having a first major surface and a second major surface, gate electrodes formed in a plurality of trenches provided in stripe form in the first major surface, with a gate oxide film interposed between the gate electrodes and the trenches, a transistor having an emitter layer formed on the first major surface side, a base layer of a second conduction type formed below the emitter layer and bordering the gate oxide film, and a collector layer of the second conduction type formed on the second major surface side, a diode having an anode layer of the second conduction type formed on the first major surface side, a high-concentration anode layer of the second conduction type formed on the first major surface side and having an impurity concentration higher than that in the anode layer, and a cathode layer of the first conduction type formed on the second major surface side, the diode being formed horizontally adjacent to the transistor, an interlayer film formed on the first major surface and having through grooves extending parallel to the gate electrodes, the through grooves being positioned by avoiding positions right above the gate electrodes, a barrier metal layer formed in the through grooves so as to border the anode layer and the high-concentration anode layer, tungsten plugs abutting the barrier metal layer and filling the through grooves, and an emitter electrode abutting the tungsten plugs. The width of the high-concentration anode layer is larger than the width of contact of the barrier metal layer with the high-concentration anode layer.

Other and further objects, features and advantages of the invention will appear more fully from the following description.

DETAILED DESCRIPTION OF THE PREFERRED EMBODIMENTS

Figure 1:
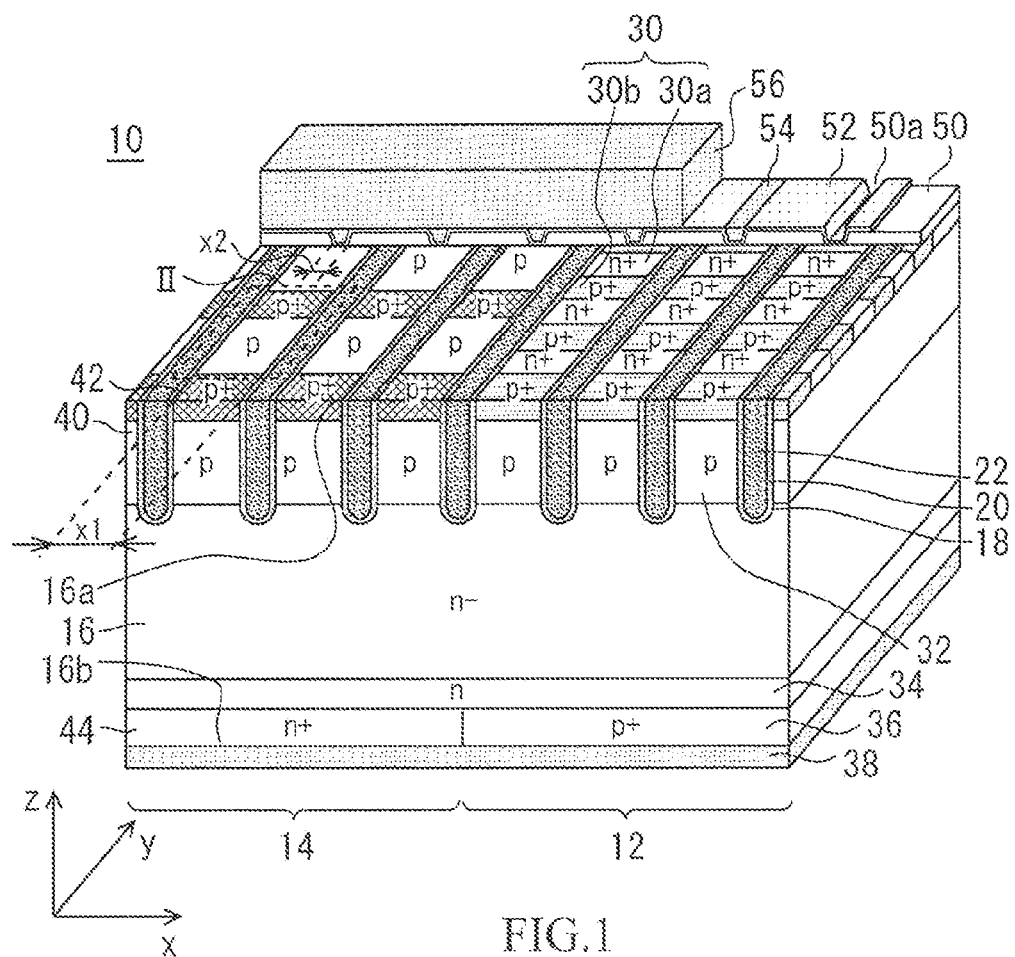
FIG. 1 is a perspective view of a reverse conducting semiconductor device according to a first embodiment.

A reverse conducting semiconductor device according to an embodiment of the present invention will be described with reference to the drawings. Component identical or corresponding to each other are indicated by the same reference characters and repeated description for them is omitted in some cases.

First Embodiment

FIG. 1 is a perspective view of a reverse conducting semiconductor device 10 according to a first embodiment of the present invention. The reverse conducting semiconductor device 10 has a transistor 12 and a diode 14 formed horizontally adjacent to the transistor 12. The transistor 12 and the diode 14 are formed on a semiconductor substrate 16. The semiconductor substrate 16 is a first conduction type (n-type) of substrate having a first major surface 16a and a second major surface 16b.

A plurality of trenches 18 in stripe form are provided in the first major surface 16a. A gate oxide film 20 is formed on inner wall surfaces of the trenches 18. The trenches 18 have gate electrodes 22 formed therein, filling the trenches 18 and bordering the gate oxide film 20. The gate electrodes 22 are formed of polysilicon for example. The trenches 18, the gate oxide film 20 and the gate electrodes 22 are formed both in the transistor 12 and in the diode 14.

The transistor 12 has an emitter layer 30 formed on the first major surface 16a side. The emitter layer 30 includes an n$^+$ emitter layer 30a and a p$^+$ emitter layer 30b. A base layer 32 of a second conduction type (p-type) bordering the gate oxide film 20 is formed below the emitter layer 30. A buffer layer 34 of a first conduction type (n-type) and a collector layer 36 of the second conduction type (p-type) are formed on the second major surface 16b side. The collector layer 36 borders a collector electrode 38. An AlSi—Ti—Ni—Au four-layer structure or a Ti—Ni—Au three-layer structure may be adopted for the collector electrode 38.

The diode 14 has an anode layer 40 of the second conduction type (p-type) and a high-concentration anode layer 42 of the second conduction type ($p^+$-type) on the first major surface 16a side. The impurity concentration in the high-concentration anode layer 42 is higher than that in the anode layer 40. In the first major surface 16a in the diode 14, both the anode layer 40 and the high-concentration anode layer 42 appear. It is desirable that the $p^+$ emitter layer 30b and the high-concentration anode layer 42 be formed simultaneously with each other. The buffer layer 34 of the first conduction type (n-type) and a cathode layer 44 of the first conduction type ($n^+$-type) are formed on the second major surface 16b side. The cathode layer 44 borders the collector electrode 38.

An interlayer film 50 is formed of an insulating material such as $SiO_2$ on the first major surface 16a. The interlayer film 50 has through grooves 50a extending parallel to the gate electrodes 22, the through grooves 50a being positioned by avoiding positions right above the gate electrodes 22. The through grooves 50a are formed on the anode layer 40 and the high-concentration anode layer 42 in the diode 14 and are formed on the emitter layer 30 in the transistor 12.

A barrier metal layer 52 is formed on the interlayer film 50 and in the through grooves 50a. The barrier metal layer 52 borders the anode layer 40 and the high-concentration anode layer 42 in the diode 14, and borders the emitter layer 30 in the transistor 12. The material of the barrier metal layer 52 is, for example, Ti, TiSi, TiN, Co, CoSi or Ni.

The width x1 of the high-concentration anode layer 42 is larger than the width x2 of contact of the barrier metal layer 52 with the high-concentration anode layer 42. Therefore, the area of contact between the barrier metal layer 52 and the high-concentration anode layer 42 is not changed even if the position of the barrier metal layer 52 is shifted in the x-positive or x-negative direction due to manufacturing variation.

The through grooves 50a are filled with tungsten plugs 54 abutting on the barrier metal layer 52. Mutual diffusion between the tungsten plugs 54 and the semiconductor substrate 16 is limited by the barrier metal layer 52. An emitter electrode 56 abuts on the tungsten plugs 54. The emitter electrode 56 is formed of AlSi for example.

Part of the first major surface 16a is exposed in FIG. 1 for convenience of explanation. In the actual reverse conducting semiconductor device, the first major surface 16a is covered with the interlayer film 50 and the barrier metal layer 52.

Figure 2:
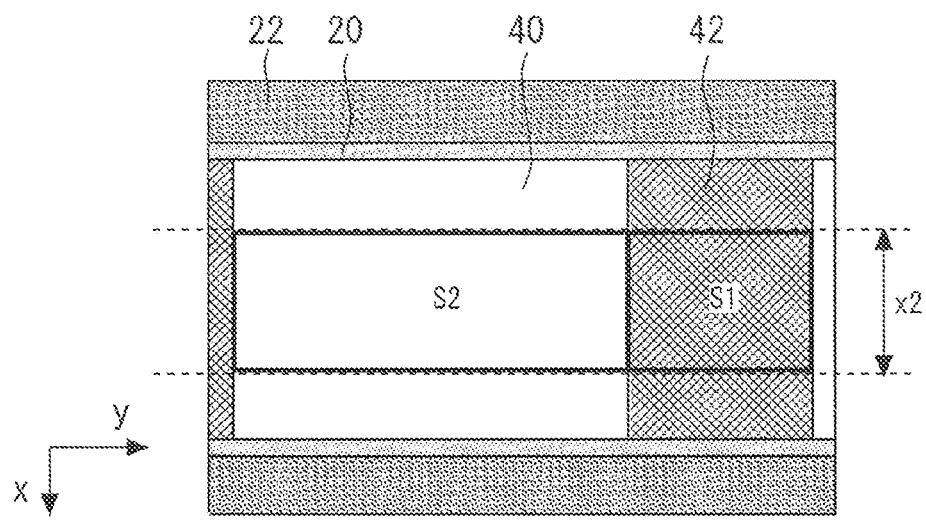
FIG. 2 is a plan view of an anode cell surrounded by a dotted line frame II in FIG. 1.

FIG. 2 is a plan view of an anode cell surrounded by a dotted line frame II in FIG. 1. The anode cell is a recurring unit in the pattern of the anode layer 40 and the high-concentration anode layer 42. The width of contact of the barrier metal layer with the high-concentration anode layer 42 is x2 (hereinafter referred to simply as contact width x2 as occasion demands). A contact area S1 shown as the area of a portion surrounded by a thick frame line on the right-hand side is the area of contact between the high-concentration anode layer 42 and the barrier metal layer per anode cell. A contact area S2 shown as the area of a portion surrounded by a thick frame line on the left-hand side is the area of contact between the anode layer 40 and the barrier metal layer per anode cell. As is apparent from FIG. 2, the contact area S1 is smaller than the contact area S2.

Figure 3:
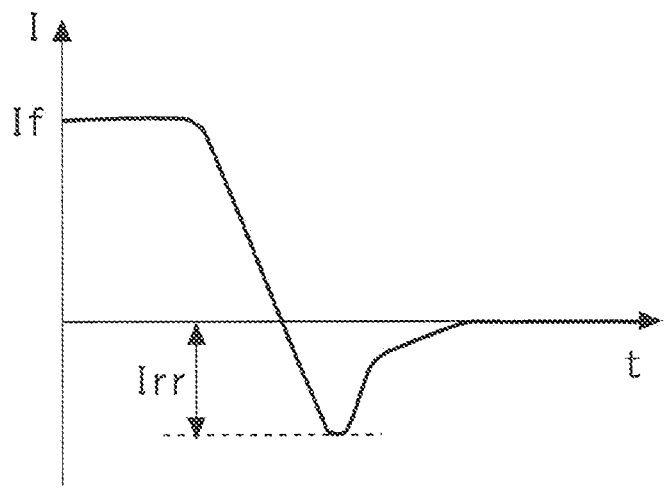
FIG. 3 shows a current waveform at the time of reverse recovery when the diode is turned off from the on state.

FIG. 3 shows a current waveform at the time of reverse recovery when the diode is turned off from the on state. When the diode is turned off from the on state, a reverse current flows from the cathode layer toward the anode layer. A peak value of this reverse current is called recovery current (Irr). It is necessary to limit the recovery current because the recovery current is an energy loss. To limit the recovery current, the impurity concentration in the anode is reduced. More specifically, the recovery characteristic of the diode is improved by reducing the contact area S1. However, if the contact area S1 is reduced, the contact resistance is increased and the carrier injection efficiency is reduced, resulting in a considerable increase in voltage drop ($V_F$) at the time of energization of the diode 14 with a forward bias.

An optimum value of the contact area S1 is determined by considering the situation where the recovery current and the contact resistance are determined by the magnitude of the contact area S1. If the width of the high-concentration anode layer 42 shown in FIG. 2 is equal to the contact width x2, the contact area S1 is changed when the barrier metal layer is shifted in the x-positive or x-negative direction due to manufacturing variation. In such a case, the designed contact area S1 cannot be maintained. In the first embodiment of the present invention, therefore, the width x1 of the high-concentration anode layer 42 shown in FIG. 1 is set larger than the contact width x2, thereby ensuring that the area S1 of contact of the barrier metal layer 52 with the high-concentration anode layer 42 is constant even when the barrier metal layer is shifted in position.

Figure 4:
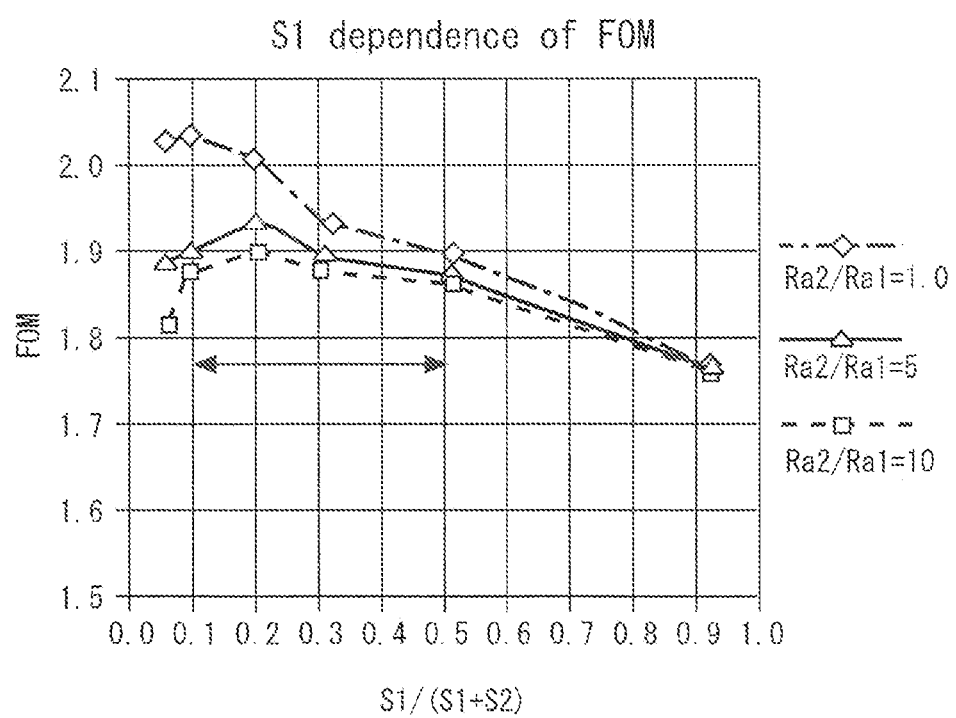
FIG. 4 is a graph showing results of a TCAD simulation.

A suitable value of the contact area S1 will be examined. FIG. 4 is a graph showing results of a TCAD simulation of FOM when the ratio of the contact area S1 and the contact area S2 is changed. FOM is a value computed by $100/(V_F \times Irr)$. If FOM is larger, the diode characteristic is better. In the TCAD simulation, the sum of S1 and S2 (total area: Stotal) was made constant. To simulate the contact resistance, the simulation was executed by constructing a model in which a series resistance Ra1 [$\Omega \cdot cm^2$] is connected to the high-concentration anode layer and a series resistance Ra2 [$\Omega \cdot cm^2$] is connected to the anode layer. Each of the series resistances Ra1 and Ra2 is a contact resistance value per unit area.

When Ra2/Ra1 is 1.0, the contact resistances of the high-concentration anode layer and the anode layer are equal to each other while the impurity concentration in the high-concentration anode layer is higher than that in the anode layer. When the contact area S1 is reduced under this condition, FOM is increased and the diode characteristic is improved.

Since the impurity concentration in the high-concentration anode layer is higher than that in the anode layer, the contact resistance of the high-concentration anode layer is lower than that of the anode layer. In a case where Ra2/Ra1 is 10, FOM has a maximum value with respect to the area ratio of the contact area S1 and the contact area S2. That is, if the contact area S1 is set to an excessively small value, the recovery characteristic is improved (Irr is reduced) but the sum total of the contact resistances per anode cell is abruptly increased and $V_F$ is increased, resulting in degradation in terms of FOM. Also in a case where Ra2/Ra1 is 5, the same tendency is shown as that in the case where Ra2/Ra1 is 10. That is, when the contact area S1 is set to an excessively small value, degradation in terms of FOM results. The sum total Rtotal of the contact resistances is obtained by (Ra1× Ra2)/(Stotal×Ra1+(Ra2−Ra1)×S1).

As described above, an improvement in recovery characteristic and an increase in contact resistance occur simultaneously with each other with reduction in contact area S1 and, therefore, FOM, which is expressed by the product thereof, has a maximum value. According to this simulation result, the maximum point of FOM exists in a region where S1/(S1+S2) is smaller than 0.5 and it is preferable to satisfy S1<S2 in order to obtain a good FOM value. More specifically, it is preferable to set the contact area S1 and the contact area S2 so as to satisfy 0.1<S1/(S1+S2)<0.5.

Setting the resistance of the high-concentration anode layer 42 per unit area (Ra1) to ⅕ or less of the resistance of the anode layer 40 per unit area (Ra2) enables FOM to have a significant maximum value. It is, therefore, desirable to set Ra1 to ⅕ or less of Ra2.

Figure 5:
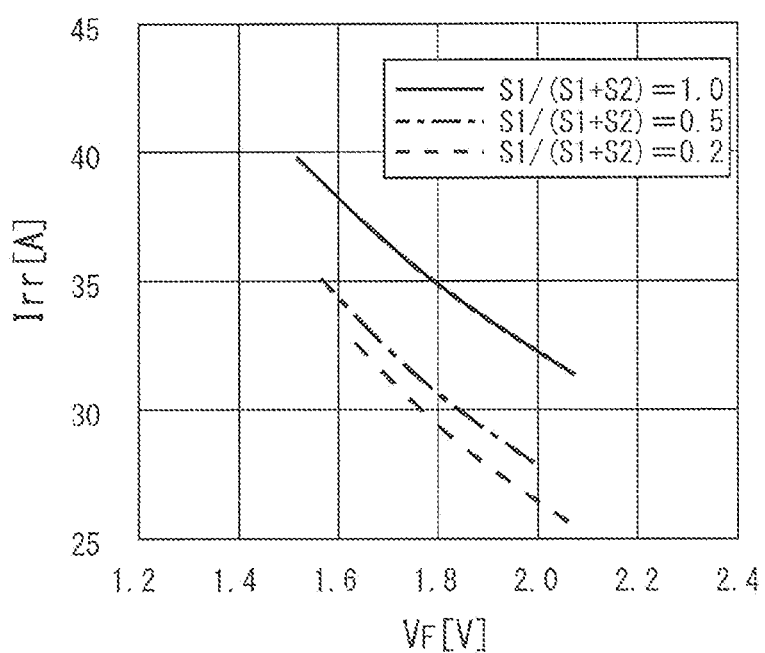
FIG. 5 is a graph showing Irr-$V_F$ trade-off curves.

FIG. 5 is a graph showing Irr-$V_F$ trade-off curves. These trade-off curves were obtained as a result of actual measurements on three working prototypes respectively having S1/(S1+S2) values of 1, 0.5, and 0.2. From this graph, it can be understood that the diode characteristic can be improved by reducing the proportion of the contact area S1.

The reverse conducting semiconductor device according to the first embodiment of the present invention can be variously modified. While the high-concentration anode layer 42 shown in FIG. 1 borders the gate oxide film 20, the high-concentration anode layer may be formed by providing a gap of 0.1 μm to several microns between the high-concentration anode layer and the gate oxide film 20. The trenches 18 in the diode 14 may be filled with an insulating film instead of being filled with gate electrodes 22.

While the semiconductor substrate 16 may be formed of Si, it is preferable that the semiconductor substrate 16 be formed of a wide-bandgap semiconductor. The wide-bandgap semiconductor is, for example, silicon carbide, a gallium nitride-based material or diamond. While the first conduction type and the second conduction type have been described as n-type and p-type, respectively, the conduction types may be reversed. These modifications can be applied as desired to a reverse conducting semiconductor device according to an embodiment described below.

Second Embodiment

Figure 6:
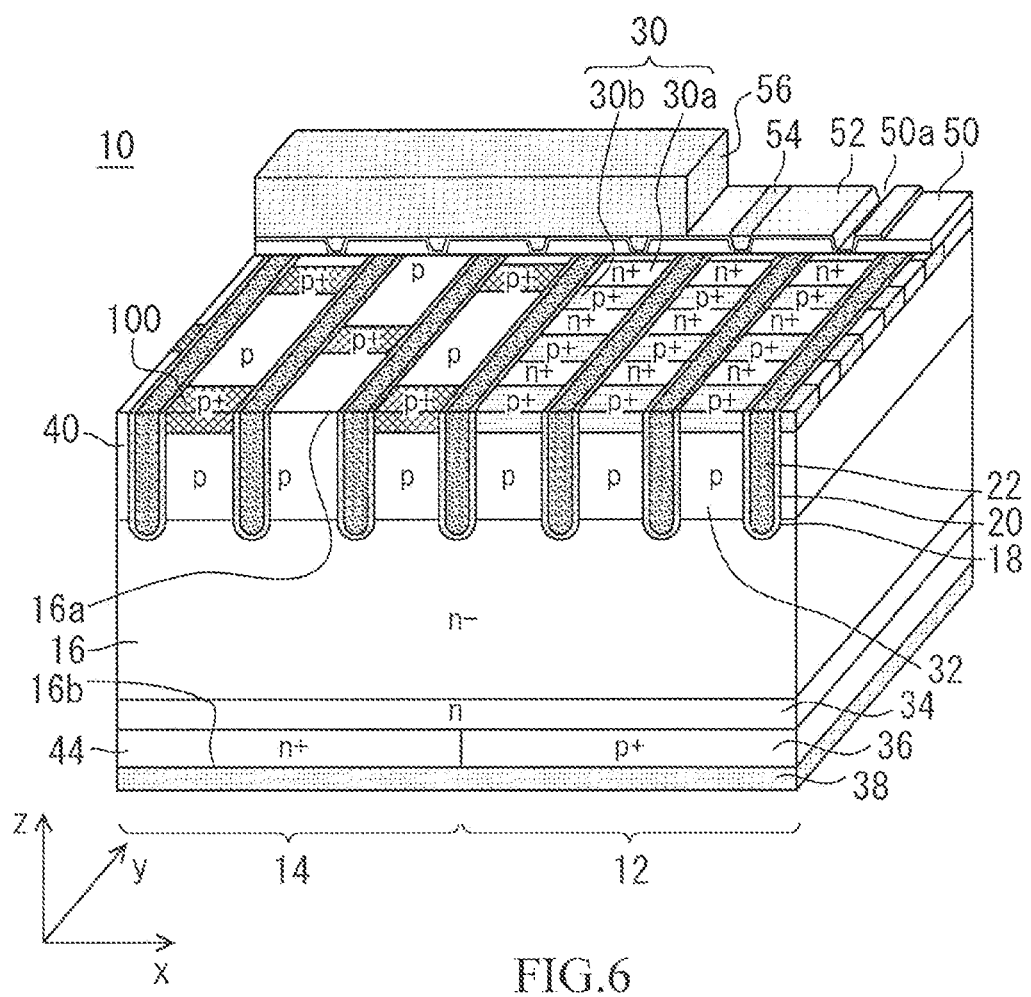
FIG. 6 is a perspective view of a reverse conducting semiconductor device according to a second embodiment.

FIG. 6 is a perspective view of a reverse conducting semiconductor device according to a second embodiment of the present invention. The reverse conducting semiconductor device according to the second embodiment have a number of commonalities with the first embodiment and will therefore be described with respect to points of difference from the first embodiment. Segments of a high-concentration anode layer 100 are disposed in a staggered pattern as viewed in plan. That is, the high-concentration anode layer 100 is formed in zigzag such that each segment of the high-concentration anode layer does not border any of the other segments through the gate oxide film 20 and the gate electrode 22.

Disposing segments of a high-concentration anode layer 100 in a staggered pattern as viewed in plan enables uniformization of the current distribution in the diode 14. Prevention of a local increase in temperature of the diode 14 at a particular position can be achieved by uniformizing the current distribution.

According to the present invention, the width of the high-concentration anode layer is set larger than the width of contact of the barrier metal layer and the high-concentration anode layer, thereby ensuring that the area of contact between the barrier metal layer and the high-concentration anode layer is constant.

Obviously many modifications and variations of the present invention are possible in the light of the above teachings. It is therefore to be understood that within the scope of the appended claims the invention may be practiced otherwise than as specifically described.

What is claimed is:

1. A reverse conducting semiconductor device, comprising:
   a semiconductor substrate of a first conduction type having a first major surface and a second major surface;
   gate electrodes formed in a plurality of trenches provided in stripe form in the first major surface, with a gate oxide film interposed between the gate electrodes and the trenches;
   a transistor having an emitter layer formed on the first major surface side, a base layer of a second conduction type formed below the emitter layer and bordering the gate oxide film, and a collector layer of the second conduction type formed on the second major surface side;
   a diode having an anode layer of the second conduction type formed on the first major surface side, a high-concentration anode layer of the second conduction type formed on the first major surface side and having an impurity concentration higher than that in the anode layer, and a cathode layer of the first conduction type formed on the second major surface side, the diode being formed horizontally adjacent to the transistor;
   an interlayer film formed on the first major surface and having through grooves extending parallel to the gate electrodes, the through grooves not overlapping the gate electrodes in a vertical direction;
   a barrier metal layer formed in the through grooves so as to contact the anode layer and the high-concentration anode layer;
   tungsten plugs abutting the barrier metal layer and filling the through grooves; and
   an emitter electrode abutting the tungsten plugs,
   wherein the width of the high-concentration anode layer is larger than the width of contact of the barrier metal layer with the high-concentration anode layer
   wherein a recurring unit in a pattern of the anode layer and the high-concentration anode layer is an anode cell, and wherein the area S1 of contact between the high-concentration anode layer and the barrier metal layer per each of anode cells, is smaller than the area S2 of contact between the anode layer and the barrier metal layer per anode cell.

2. The reverse conducting semiconductor device according to claim 1, wherein the contact area S1 and the contact area S2 satisfy 0.1<S1/(S1+S2)<0.5.

3. The reverse conducting semiconductor device according to claim 1, wherein the resistance of the high-concentration anode layer per unit area is equal to or smaller than ⅕ of the resistance of the anode layer per unit area.

4. The reverse conducting semiconductor device according to claim 1, wherein segments of the high-concentration anode layer are disposed in a staggered pattern with respect to one another and the anode layer, as viewed in plan.

5. The reverse conducting semiconductor device according to claim 1, wherein the semiconductor substrate is formed of a wide-bandgap semiconductor.

6. The reverse conducting semiconductor device according to claim 5, wherein the wide-bandgap semiconductor is silicon carbide, a gallium nitride-based material or diamond.

* * * * *